United States Patent
Radossi et al.

(10) Patent No.: US 8,833,180 B2
(45) Date of Patent: Sep. 16, 2014

(54) THREAD TENSIONING MEMBER IN WELDED HEADER STRUCTURE

(71) Applicant: Kulite Semiconductor Products, Inc., Leonia, NJ (US)

(72) Inventors: Sergio Radossi, Ridgefield Park, NJ (US); Adam Kane, Morristown, NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 73 days.

(21) Appl. No.: 13/735,657

(22) Filed: Jan. 7, 2013

(65) Prior Publication Data
US 2013/0174671 A1    Jul. 11, 2013

Related U.S. Application Data

(60) Provisional application No. 61/583,478, filed on Jan. 5, 2012.

(51) Int. Cl.
*G01L 1/00* (2006.01)
*G01L 19/14* (2006.01)

(52) U.S. Cl.
CPC .............. *G01L 1/00* (2013.01); *G01L 19/147* (2013.01)
USPC ....................................... 73/862.381; 73/850

(58) Field of Classification Search
USPC ...................... 73/862.381, 761, 850
See application file for complete search history.

(56) References Cited

U.S. PATENT DOCUMENTS

| 4,492,391 A * | 1/1985 | Haines ........................ 285/114 |
| 6,612,180 B1 * | 9/2003 | Kurtz ............................ 73/754 |
| 7,198,189 B2 * | 4/2007 | Stol et al. ..................... 228/2.1 |
| 2006/0065694 A1 * | 3/2006 | Stol et al. ..................... 228/2.1 |
| 2006/0162937 A1 * | 7/2006 | Costa et al. ................... 166/380 |
| 2012/0160363 A1 * | 6/2012 | Jin et al. ....................... 138/177 |

* cited by examiner

*Primary Examiner* — Max Noori
(74) *Attorney, Agent, or Firm* — Troutman Sanders LLP; James E. Schutz

(57) ABSTRACT

An improved header assembly and corresponding port assembly comprising a tensioning member, wherein the tensioning member is isolated and separate from the weld portion and is adapted to place a threaded portion between the header assembly and port assembly in tension and maintain such tension, and thus relieve tension from the weld, before and after welding, thereby increasing the lifespan of the header and port assemblies.

20 Claims, 5 Drawing Sheets

THREAD TENSIONING MEMBER IN WELDED HEADER STRUCTURE

CROSS-REFERENCE TO RELATED APPLICATION

This application claims priority under 35 U.S.C. 119(e) to U.S. Provisional Application 61/583,478, filed Jan. 5, 2012, the entire contents of which are hereby incorporated by reference.

TECHNICAL FIELD

The present invention relates to welded header structure assemblies and methods of making same.

BACKGROUND

Many pressure transducer assemblies are configured to include a header portion that houses a sensing element and a port portion, wherein the header is attached to the port portion. The attachment between the header and port portions enable electrical connection between the sensing element and the remaining electronic components within the pressure transducer assembly. The header/port attachment serves to seal and contain the pressure media in the manifold/pipe, etc., while isolating the electrical components from the media, and allowing assembly of the electronics to the pressure sensing sub assembly.

Typically, the header portion is welded to the port portion and, in many embodiments, the header portion comprises a threaded section that mates with a corresponding threaded section on the port portion, as illustrated in FIG. 1. The threads are provided to take the load off the welded section. In use, the welded portion may experience stresses due to internal pressures in the design. These stresses include the hoop stress or tangential stress, and radial stress.

It was once believed that the thread would aid in removing the tensile stress from the weld area. However, several micrographs of experimental and production designs indicate that the threads may become disengaged during welding, thereby placing tensile stress on the welded area. The weld is typically an electron beam weld, and as the material melts to form the weld, any preload on the structure may be removed. Consequently, this increases the stress on the welded portion and reduces the fatigue life of the pressure transducer assembly considerably.

BRIEF SUMMARY

The various embodiments of the present invention provide a transducer structure, comprising a header assembly comprising a first threaded portion, a port assembly comprising a second threaded portion that correspondingly mates with the first threaded portion, an access point at a header assembly-port assembly interface, and a tensioning member isolated from the access point, wherein the tensioning member is adapted to maintain tension between mated first and second threaded portions during welding.

Other embodiments provide a transducer structure, comprising a header assembly comprising a first threaded portion, a port assembly comprising a second threaded portion that correspondingly mates with the first threaded portion, a weld at an interface between the header assembly and port assembly, and a tensioning member isolated from the weld, wherein the tensioning member is adapted to maintain tension between mated first and second threaded portions during welding.

DETAILED DESCRIPTION

Figure 1:
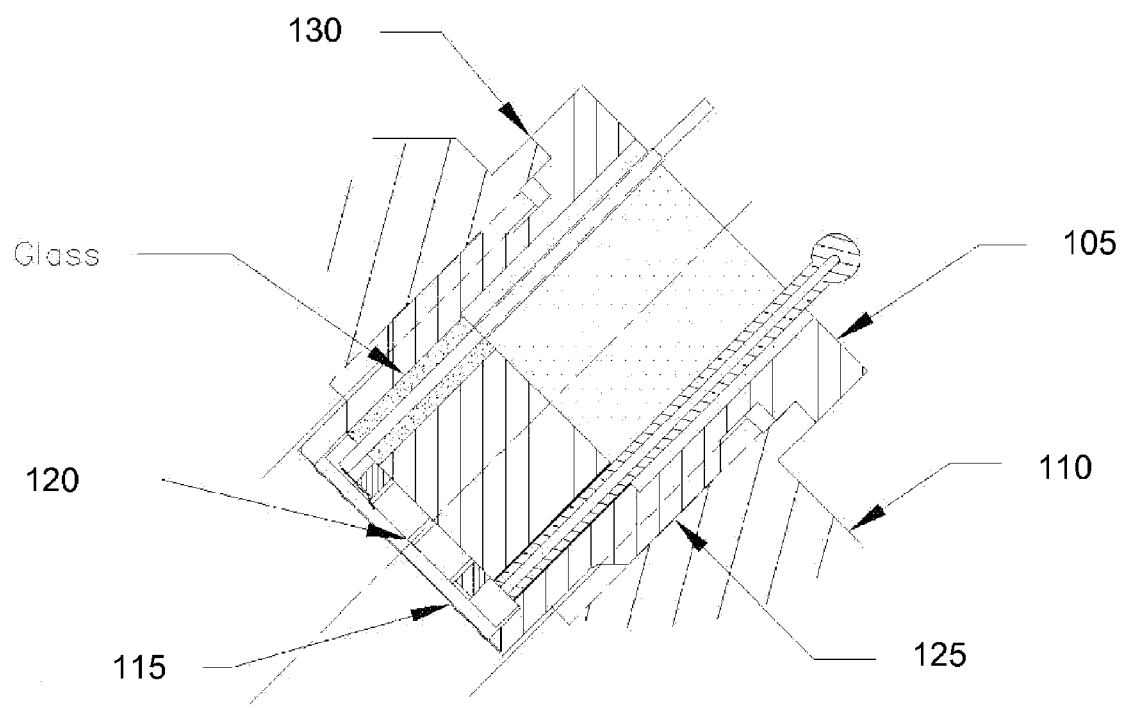
FIG. 1 illustrates a prior art embodiment of a header and port assembly without a tensioning member.

Although preferred embodiments of the invention are explained in detail, it is to be understood that other embodiments are contemplated. Accordingly, it is not intended that the invention is limited in its scope to the details of construction and arrangement of components set forth in the following description or illustrated in the drawings. The invention is capable of other embodiments and of being practiced or carried out in various ways. Also, in describing the preferred embodiments, specific terminology will be resorted to for the sake of clarity.

It must also be noted that, as used in the specification and the appended claims, the singular forms "a," "an," and "the" include plural referents unless the context clearly dictates otherwise.

Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a device or system does not preclude the presence of additional components or intervening components between those components expressly identified.

Referring now to the drawings, in which like numerals represent like elements, exemplary embodiments of the present invention are herein described. It is to be understood that the figures and descriptions of the present invention have been simplified to illustrate elements that are relevant for a clear understanding of the present invention, while eliminating, for purposes of clarity, many other elements found in typical pressure sensor assemblies and chip-package assemblies and methods of making and using the same. Those of ordinary skill in the art will recognize that other elements are desirable and/or required in order to implement the present invention. However, because such elements are well known in the art, and because they do not facilitate a better understanding of the present invention, a discussion of such elements is not provided herein.

Exemplary embodiments of the present invention provide an improved header assembly and corresponding port assembly comprising a tensioning member. The tensioning member is isolated and separated from a weld portion connecting the header and port at an interface and is adapted to place a threaded portion connecting the header and port in tension and maintain such tension before, during, and after welding, thereby increasing the lifespan of the header and port assemblies.

Referring to FIG. 1, there is shown a prior art embodiment of a header assembly 105 connected to a corresponding port assembly 110. As illustrated, the header assembly 105 comprises an isolation diaphragm 115 adapted to receive an incoming pressure stream, and a sensing die plate 120 adapted to submit a signal indicative of the incoming pressure stream. The header assembly 105 may be inserted into a corresponding port assembly 110 via corresponding threading portions. For example, the header assembly 105 may comprise a first threaded portion, and the port assembly 110 may comprise a second threaded portion that correspondingly mates with the first threading portion. To connect the header assembly 105 to the port assembly 110, the header assembly 105 may be threaded into the port assembly 110 such that the first threaded portion of the header assembly 105 engages the second threaded portion of the port assembly 110, thereby creating a threaded portion 125. To further support the connection between the header assembly 105 and the port assembly 110, a connecting weld 130 is applied at a header-port interface.

Figure 2:
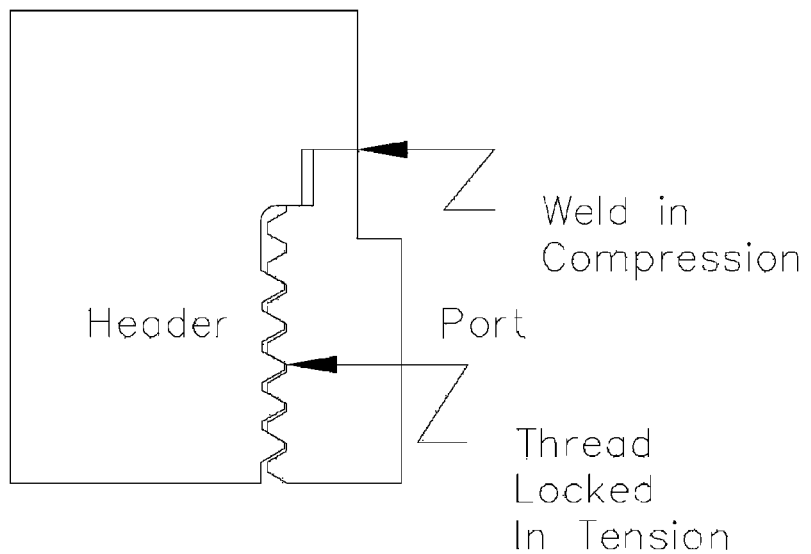
FIG. 2 illustrates a prior art embodiment of a header and port assembly prior to welding with threads engaged and locked in tension.
Figure 3:
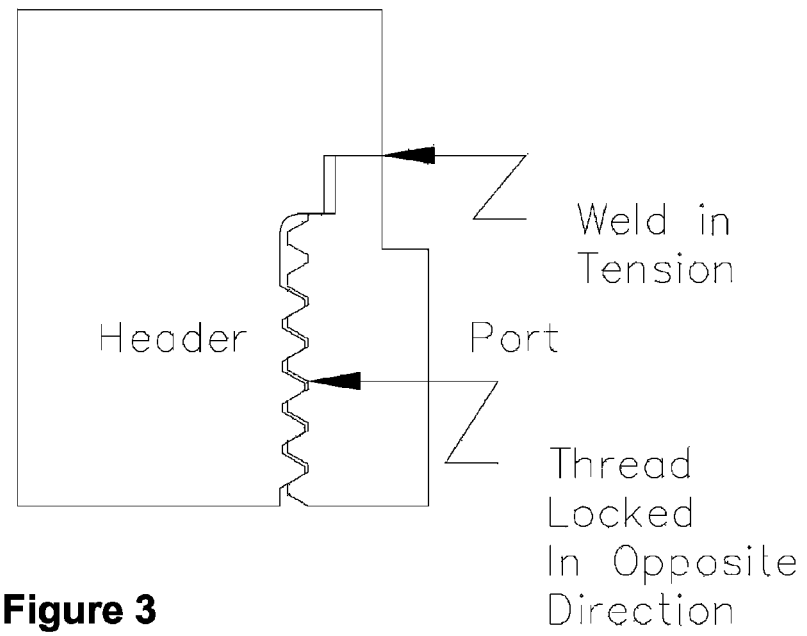
FIG. 3 illustrates a prior art embodiment of a header and port assembly after welding with threads unlocked.

Referring to FIGS. 2 and 3, there is shown sample prior art embodiments of a header assembly and corresponding port assembly before and after welding, respectively. To connect the header assembly to the corresponding port assembly, a first threaded portion on the header assembly engages a second threaded portion on the port assembly. The first threaded portion is torqued onto the second threaded portion until it engages a thread stop. Once the thread stop is engaged, it consequently imparts tension to the first and second threaded portions. After threading, it may be desirable to weld the header assembly to the port assembly at a location substantially adjacent the thread stop, which may consequently compromise the tension between the first and second threaded portions. To securely connect the header assembly to the port assembly, however, it is useful for the first and second threaded portions to remain in tension. If the tension between the first and second threaded portions is compromised, additional stress may be carried by the weld joint, which may reduce the lifespan of the assembly, as further described below.

To further secure the header assembly to the port assembly a weld is typically made at an external access point located between the header assembly and port assembly at an interface therebetween. The welding process, however, often times compromises the tension between the first and second threaded portions. Specifically, the header and port assemblies are often constructed of metals having melting points lower than or around the same temperature as the welding temperature. In many prior art embodiments, the thread stop is located near the location of the weld. This close proximity often times causes the thread stop to melt during welding, which consequently compromises the tension between the engaged threaded portions. When the tension between the first and second threaded portion is compromised, the tension is transferred to the welded portion, which increases the likelihood of crack propagation and consequently reduces the lifespan of the overall assembly.

Thus, there is a need to create a header assembly and corresponding port assembly that may be constructed of metals having lower or substantially similar melting temperatures as the welding temperature, can withstand stress caused by the act of welding, and be able to maintain the tension between engaged threaded portions of the header and port assemblies before, during, and after welding even if the thread stop is compromised by melting. In exemplary embodiments of the present invention, this is accomplished by utilizing a tensioning member that is separate and isolated from an access point where the weld is located. The tensioning member absorbs stress caused by welding and works to effectively maintain the tension within the engaged threaded portions thereby maintaining the integrity of the overall structure.

Figure 4:
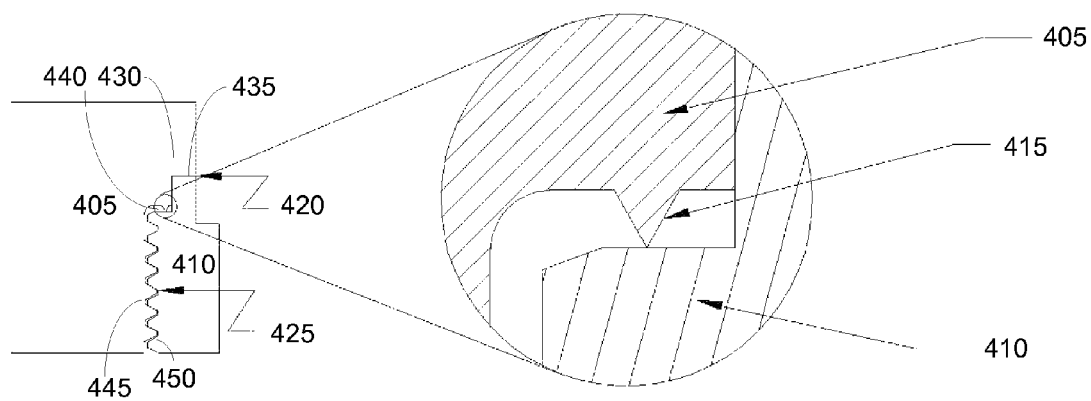
FIG. 4 illustrates an exemplary embodiment of a header and port assembly of the present invention comprising a tensioning member.

Referring to FIG. 4, there is shown an exemplary embodiment of a header assembly 405 and a corresponding port assembly 410. In the various embodiments of the present invention, the header assembly 405 comprises a tensioning member 415 and a threaded portion that connects to a mating threaded portion on the port assembly 410. To connect the header assembly 405 to the port assembly 410, the threaded portion of the header assembly 405 is torqued onto the mating threaded portion on the port assembly 410. During said torquing, the tensioning member 415 is slightly deformed, which subsequently imparts tension to the threaded portion 425. The tensioning member 415 acts as a crush ring or a spring, and thus locks the threaded portion 425 in tension, and this tension is maintained before, during, and after welding the header assembly 405 to the port assembly 410.

As further illustrated in FIG. 4, there is an access point 420 at a header assembly-port assembly interface. This access point 420 enables a user to weld the header assembly and port assembly together. Therefore, the access point 420 may also be the weld location. As illustrated in FIG. 4, the tensioning member 415 is separate and isolated from the access point 420. This separation and isolation from the access point 420 is important as it enables the preloaded tension applied to the threaded portion 425 via the tensioning member 415 to be maintained during the welding of the header assembly to the port assembly at the access point 420, therefore providing a distinct advantage over prior art embodiments Further, the isolation of the tensioning member 415 from the access point 420 prevents the tensioning member 415 from being compromised by melting during welding.

Additionally, in an exemplary embodiment, the header assembly 405 may comprise a first threaded portion 445 and a first thread stop 430. The port assembly 410 comprises a complimentary second threaded portion 450 and a complimentary second thread stop 435. The header assembly 405 can be threaded onto the port assembly 410 via the complimentary second threaded portion 450 located on the port assembly 410 to create a joined threaded portion 425. The header assembly 405 may be torqued onto the port assembly 410 until the first thread stop 430 engages the second thread stop 435. Alternatively, the header assembly 405 may be torqued onto the port assembly 410 until the first and second threaded portions 445/450 are substantially engaged as the first thread stop 430 and second thread stop 435 do not have to necessarily engage. It shall be understood that the thread stop locations may be adjusted for various implementations.

As the header assembly 405 is threaded onto the port assembly 410, the tensioning member 415 is deformed or compressed within a tensioning region 440. This deformation or compression "loads" the tensioning member 415, which consequently can maintain the tension within the threaded portion 425 during welding. In certain implementations, the access point 420 where the weld is carried out is substantially near the first thread stop 430, and the second thread stop 435 if the first and second threaded portions 445/450 are completely engaged. Thus, if the welding temperature exceeds or is substantially near the melting point of the header assembly 405 or port assembly 410 materials, it may melt the thread stops. In prior art embodiments, this melting would compromise the tension between the first and second threaded portions 445/450. However, because the tensioning member 415 is isolated from the access point 420, and thus the welding region, the integrity of the tensioning member 415 is maintained throughout the welding process, which consequently maintains the tension between the first and second threaded portions 445/450.

Figure 5:
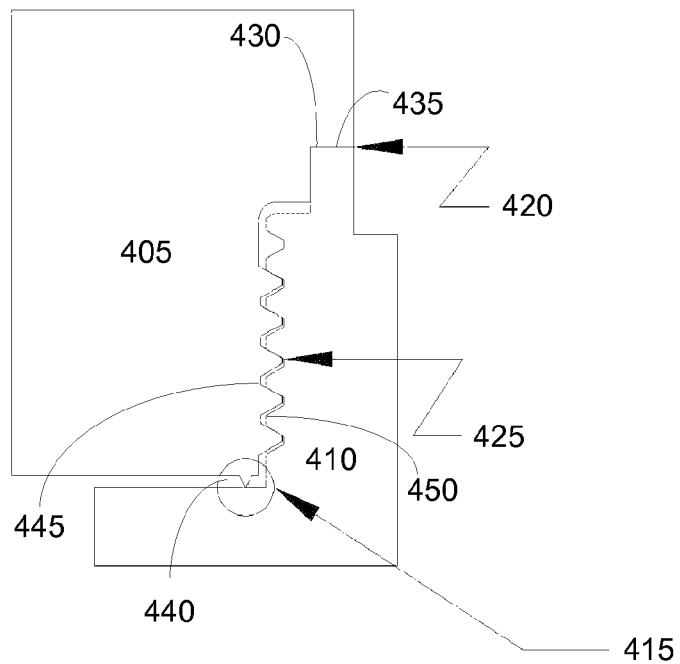
FIG. 5 illustrates another exemplary embodiment of a header and port assembly of the present invention comprising a tensioning member.

There are many internal locations where the tensioning member 415 may be placed relative to the threaded portion 425 and access point 420. As illustrated in FIG. 4, the tensioning member 415 may be placed between the threaded portion 425 and the access point 420 at a distance that is separate and isolated from the access point 420. In alternative embodiments, and as illustrated in FIG. 5, the tensioning member 415 may be opposite the threaded portion 425 and the access point 420. It shall be understood that the location of the tensioning member 415 is not limited to the placements illustrated in FIGS. 4 and 5. The tensioning member 415 may be placed in other locations depending on the header and port assembly design. For example, in other embodiments, the tensioning member 415 may be placed towards the front of a header assembly, thereby forming a compression of the header thread in the direction towards the top of the header assembly. In most embodiments, however, the tensioning member is an internal component and is isolated and separate from the access point to sufficiently maintain the tension within the threaded portion before, during, and after the weld.

Figure 6:
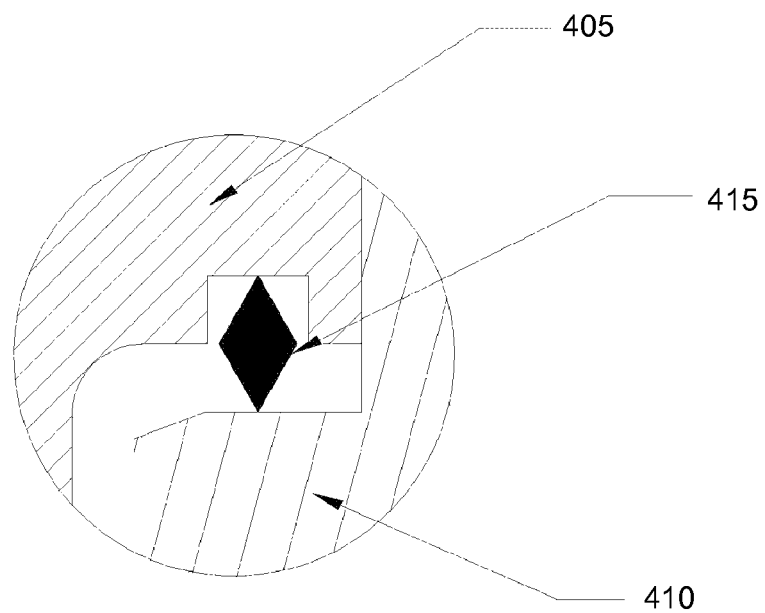
FIG. 6 illustrates yet another exemplary embodiment of a header and port assembly of the present invention comprising a tensioning member.
Figure 7:
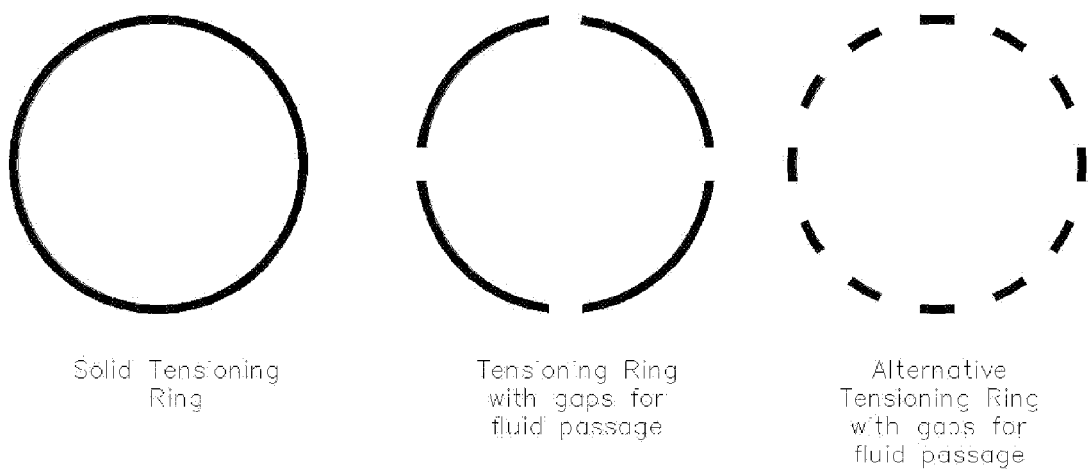
FIG. 7 illustrates exemplary embodiments of tension members in accordance with the present invention.

Further, as illustrated in FIGS. 4 and 5, the tensioning member 415 may be integrally machined as part of the header assembly 405 or, in alternative embodiments, the tensioning member may be integrally machined as part of the port assembly 410. As illustrated in FIG. 6, the tensioning member 415 may be a separate, stand-alone tensioning member 415 disposed between the header assembly 405 and port assembly 410. Additionally, the tensioning member 415 may be of various shapes and designs, for example but not limited to, a semicircular or a saw tooth profile, or a spring or coil-like profile. FIG. 7 illustrates exemplary embodiments of tensioning members. One skilled in the art will appreciate that the appropriate tensioning member is dependent upon the specific application. For example, the tensioning member may be a solid tensioning ring, or a tensioning ring with a plurality of gaps to enable air or fluid passage though the unit if so desired.

It will be apparent to those skilled in the art that modifications and variations may be made in the apparatus of the present invention without departing from the spirit or scope of the invention. It is intended that the present invention cover the modification and variations of this invention provided they come within the scope of the appended claims and their equivalents.

What is claimed is:

1. A transducer structure, comprising:
    a header assembly comprising a first threaded portion;
    a port assembly comprising a second threaded portion that correspondingly mates with the first threaded portion;
    an access point at a header assembly-port assembly interface; and
    a tensioning member isolated from the access point, wherein the tensioning member is adapted to maintain tension between mated first and second threaded portions during welding.

2. The transducer structure of claim 1, wherein the tensioning member is locationally isolated from the access point.

3. The transducer structure of claim 1, wherein the tensioning member is temperature isolated from the access point.

4. The transducer structure of claim 1, wherein the tensioning member is disposed between the header assembly and the port assembly.

5. The transducer structure of claim 1, further comprising a weld at the access point.

6. The transducer structure of claim 1, wherein the tensioning member is disposed between the access point and the mated first and second threaded portions.

7. The transducer structure of claim 1, wherein the tensioning member is disposed opposite the access point and the mated first and second threaded portions.

8. The transducer structure of claim 1, wherein the tensioning member is integrally machined as part of the header assembly.

9. The transducer structure of claim 1, wherein the tensioning member is integrally machined as part of the port assembly.

10. The transducer structure of claim 1, wherein the tensioning member is a solid ring.

11. The transducer structure of claim 1, wherein the tensioning member is a ring comprising a plurality of holes.

12. The transducer structure of claim 1, wherein the header assembly comprises a pressure sensor.

13. A transducer structure, comprising:
    a header assembly comprising a first threaded portion;
    a port assembly comprising a second threaded portion that correspondingly mates with the first threaded portion;
    a weld at an interface between the header assembly and port assembly; and
    a tensioning member isolated from the weld, wherein the tensioning member is adapted to maintain tension between mated first and second threaded portions during welding.

14. The transducer structure of claim 13, wherein the tensioning member is locationally isolated from the weld.

15. The transducer structure of claim 13, wherein the tensioning member is temperature isolated from the weld.

16. The transducer structure of claim 13, wherein the tensioning member is disposed between the header assembly and the port assembly.

17. The transducer structure of claim 13, wherein the tensioning member is integrally machined as part of the header assembly.

18. The transducer structure of claim 13, wherein the tensioning member is integrally machined as part of the port assembly.

19. The transducer structure of claim 13, wherein the tensioning member is disposed between the weld and the mated first and second threaded portions.

20. The transducer structure of claim 13, wherein the tensioning member is disposed opposite the weld and the mated first and second threaded portions.

\* \* \* \* \*